(12) United States Patent  
Hsu

(10) Patent No.: US 7,786,546 B2
(45) Date of Patent: Aug. 31, 2010

(54) SYSTEM-ON-CHIP WITH SHIELD RINGS FOR SHIELDING FUNCTIONAL BLOCKS THEREIN FROM ELECTROMAGNETIC INTERFERENCE

(75) Inventor: Yu-Hao Hsu, Taipei Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 783 days.

(21) Appl. No.: 11/608,249

(22) Filed: Dec. 8, 2006

(65) Prior Publication Data

US 2007/0085172 A1 Apr. 19, 2007

Related U.S. Application Data

(63) Continuation-in-part of application No. 10/906,583, filed on Feb. 25, 2005, now Pat. No. 7,170,144.

(51) Int. Cl.
*H01L 23/552* (2006.01)
(52) U.S. Cl. ............... 257/508; 257/659; 257/E23.151
(58) Field of Classification Search ................. 257/508, 257/659, 660, E23.151, E23.175
See application file for complete search history.

(56) References Cited

U.S. PATENT DOCUMENTS

| | | | | |
|---|---|---|---|---|
| 5,151,770 A | * | 9/1992 | Inoue | .......................... 257/660 |
| 6,998,712 B2 | * | 2/2006 | Okada et al. | ................. 257/758 |
| 7,052,939 B2 | * | 5/2006 | Huang et al. | ................. 438/146 |
| 2005/0065747 A1 | | 3/2005 | Premy et al. | |
| 2005/0282381 A1 | | 12/2005 | Cohen et al. | |

FOREIGN PATENT DOCUMENTS

JP 2006310540 A * 11/2006

OTHER PUBLICATIONS

Machine translation of JP2006-310540.*

* cited by examiner

*Primary Examiner*—Lex Malsawma
(74) *Attorney, Agent, or Firm*—Winston Hsu

(57) ABSTRACT

A system-on-chip (SoC) that is immune to electromagnetic interference has block shield rings fabricated therein. The SoC includes a microprocessor core; an on-chip bus interface; an embedded memory block; and an analog/mixed-signal integrated circuit shielded by an EMI shield ring encircling the analog/mixed-signal integrated circuit for protecting the analog/mixed-signal integrated circuit from electromagnetic interference. The EMI shield ring is grounded and includes a metal rampart consisting of multi-layer metals and vias. A pickup diffusion is connected to the metal rampart. In one embodiment, the memory block is also shielded.

14 Claims, 9 Drawing Sheets

SYSTEM-ON-CHIP WITH SHIELD RINGS FOR SHIELDING FUNCTIONAL BLOCKS THEREIN FROM ELECTROMAGNETIC INTERFERENCE

CROSS REFERENCE TO RELATED APPLICATIONS

This is a continuation-in-part of U.S. application Ser. No. 10/906,583 filed Feb. 25, 2005.

BACKGROUND OF THE INVENTION

1. Field of the Invention

The present invention relates generally to the field of system-on-chip (SoC) technology and, more particularly, to a system-on-chip with shield rings surrounding the specific functional blocks such as analogy/mixed-signal, RF signal, and/or memory blocks for the purposes of eliminating electromagnetic or static electricity interference.

2. Description of the Prior Art

Today the functionality and economics of many consumer products are being transformed by "system-on-chip" (SoC) technology. The continuing increase in the transistor densities means that it is now possible to integrate the processor, peripherals and some or all of the system memory on a single chip.

For SoC applications, it is desirable to integrate many functional blocks into a single integrated circuit. The most commonly used blocks include a microprocessor or microcontroller, static random access memory (SRAM) blocks, non-volatile memory blocks, and various special function logic blocks.

Frequencies are continuously increasing, while integration trends are squeezing entire systems into extraordinary high circuit densities. Electromagnetic interference (EMI) and signal coupling caused by EMI are becoming exceptionally crucial issues in the design of modern SoC systems.

In light of the above, there is a need in this industry to provide a solution that the EMI problems can be addressed or eliminated as early as possible during the design phase both on the aspect of the cost and on aspect of the time-to-market of the products.

SUMMARY OF THE INVENTION

It is therefore a primary object of the present invention to provide an improved system-on-chip design to solve the above-mentioned problems.

It is another object of the present invention to provide a system-on-chip that is immune to electromagnetic interference and static electricity interference.

According to the claimed invention, a system-on-chip (SoC) with EMI shield rings therein is provided. The SoC at least includes a microprocessor core; an on-chip bus interface; an embedded memory block; and an analog/mixed-signal integrated circuit shielded by an EMI shield ring encircling the analog/mixed-signal integrated circuit for protecting the analog/mixed-signal integrated circuit from electromagnetic interference. The EMI shield ring is grounded and includes a metal rampart consisting of multi-layer metals and vias. A pickup diffusion is connected to the metal rampart.

From one aspect of this invention, a shield structure in a chip is provided. The shield structure includes a first rampart consisting of a plurality of metal layers and a plurality of via layers. The first rampart has a first connection window, wherein the shield structure shields a pre-selected region of the chip, and wherein at least one serpentine signal line passes through the first connection window.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
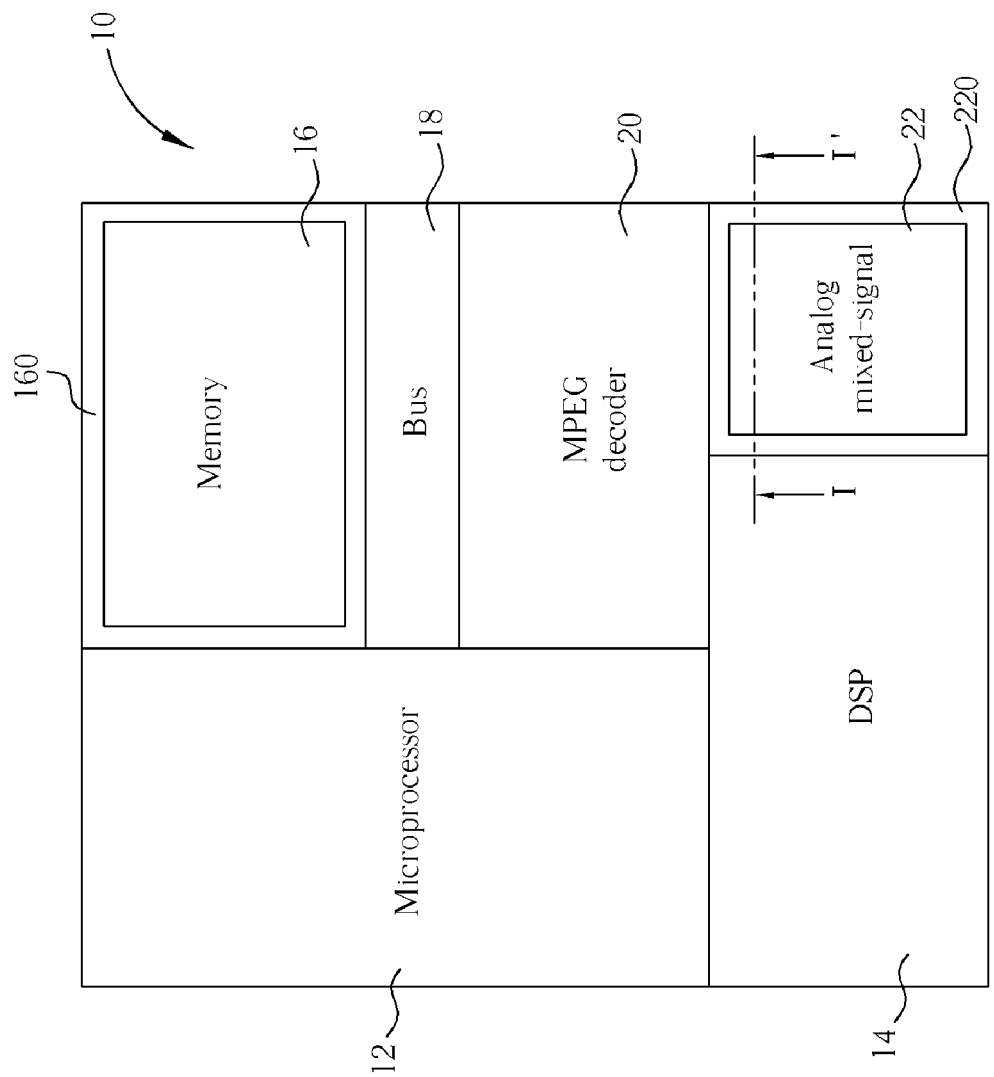
FIG. 1 is a schematic functional block diagram illustrating an exemplary system-on-chip (SoC) in accordance with one preferred embodiment of the present invention.

FIG. 1 is a schematic functional block diagram illustrating an exemplary system-on-chip (SoC) 10 in accordance with one preferred embodiment of the present invention. As shown in FIG. 1, the exemplary dual-core SoC 10, which may be suited to portable communications or multimedia applications, generally comprises an embedded processor core 12, a digital signal processor (DSP) 14, an on-chip memory block 16, an on-chip bus interface 18, an MPEG decoder 20, and an analog/mixed-signal block 22. The aforesaid functional blocks are integrated and fabricated on one single chip. It is to be understood that the configuration of the SoC 10 as set forth in FIG. 1 is presented only for illustration purposes, and should not be limiting. In another SoC configuration, an RF signal integrated circuit may be provided for other application purposes.

By way of example, the embedded processor core 12 may be a 16/32-bit RISC (abbr. of "reduced instruction set computer") microprocessor available from ARM limited. The on-chip memory block 16 may consist of a dynamic random access memory (DRAM), non-volatile memory (NVM) or the like. The salient feature of the present invention is that, as specifically indicated in FIG. 1, the on-chip memory block 16 is deliberately surrounded by a shield ring 160, and the analog/mixed-signal block 22 is deliberately surrounded by a shield ring 220.

In operation, the shield ring 160 and shield ring 220 are both grounded to create a screen to avoid signal coupling caused by electromagnetic interference resulting from the digital clock circuits that are driven at high speeds. To explain the aforesaid shield rings 160 and 220 in more detail, a schematic cross-section taken along line I-I' of FIG. 1 is demonstrated in FIG. 2.

Figure 2:
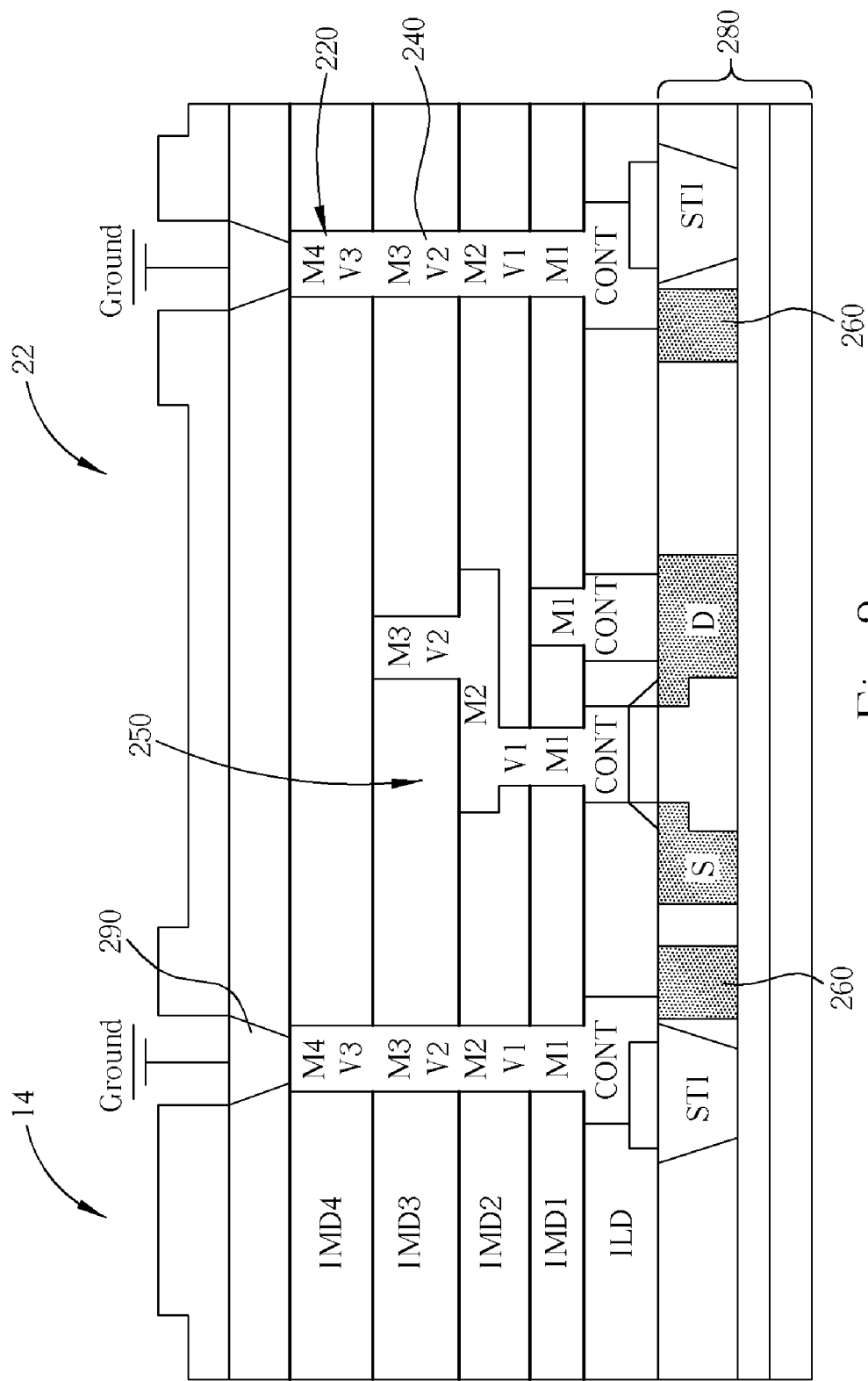
FIG. 2 is a schematic cross-section taken along line I-I' of FIG. 1.

As shown in FIG. 2, the demonstrated shield ring 220 comprises a metal rampart 240 encircling the schematic analog/mixed-signal integrated circuit 250. The metal rampart 240 is a stacked wall fabricated layer by layer including, from bottom to top, the contact layer (denoted as "CONT"), the first layer metal (M1), the first via layer (V1), the second layer metal (M2), the second via layer (V2), the third layer metal (M3), the third via layer (V3), and the fourth metal layer (M4). At the bottom of the shield ring 220, a pick up diffusion 260 is provided in the silicon-on insulator (SOI) substrate 280 to connect the metal rampart 240. The pick up diffusion 260 is implanted into the substrate 280 at positions adjacent to the shallow trench isolation (STI). At the top of the shield ring 220, a pad layer 290 is provided to connect the shield ring 220 with a ground line.

Figure 3:
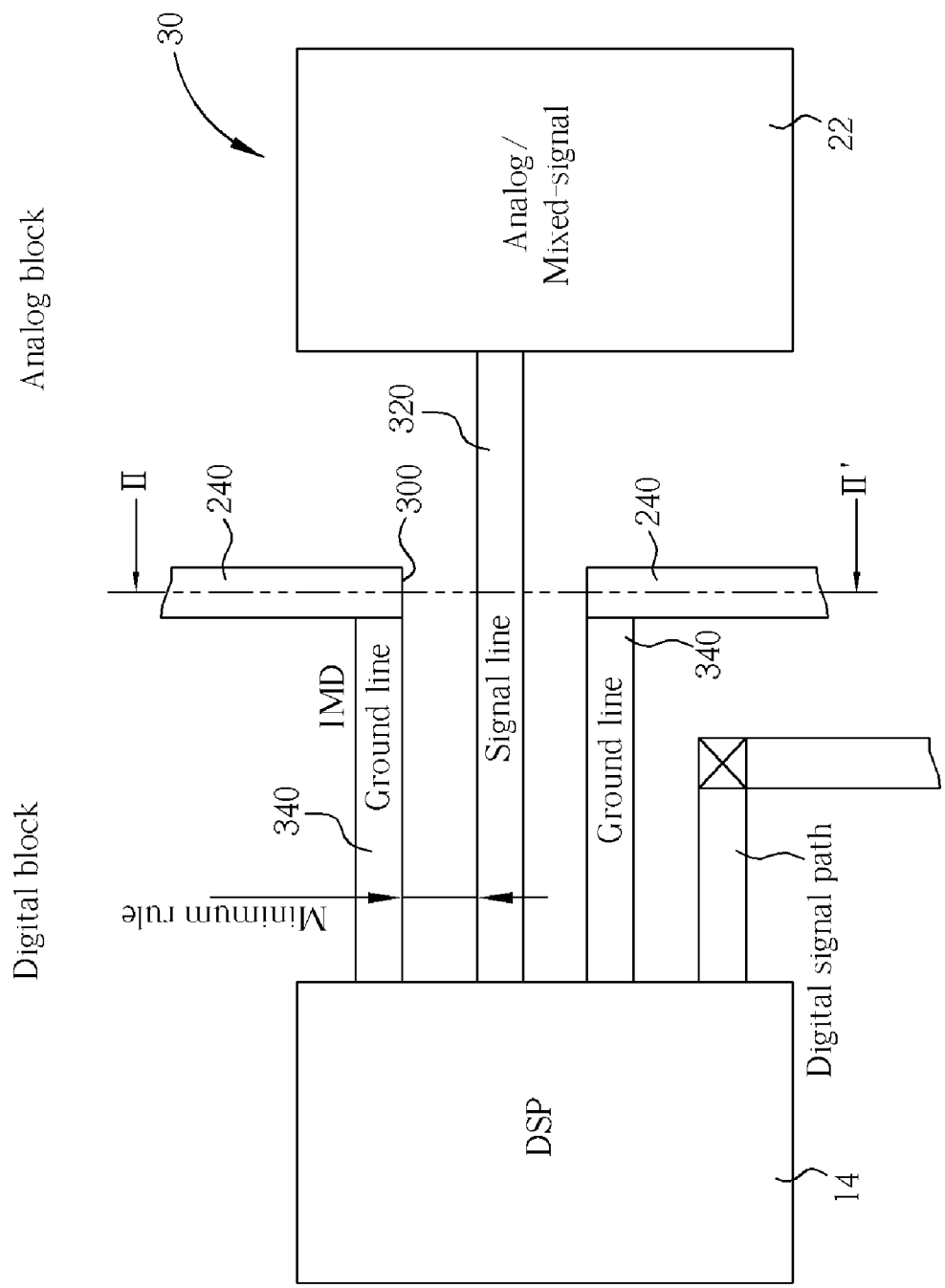
FIG. 3 is a schematic top view showing a portion of the shield ring at the analog/digital interface of the SoC.
Figure 4:
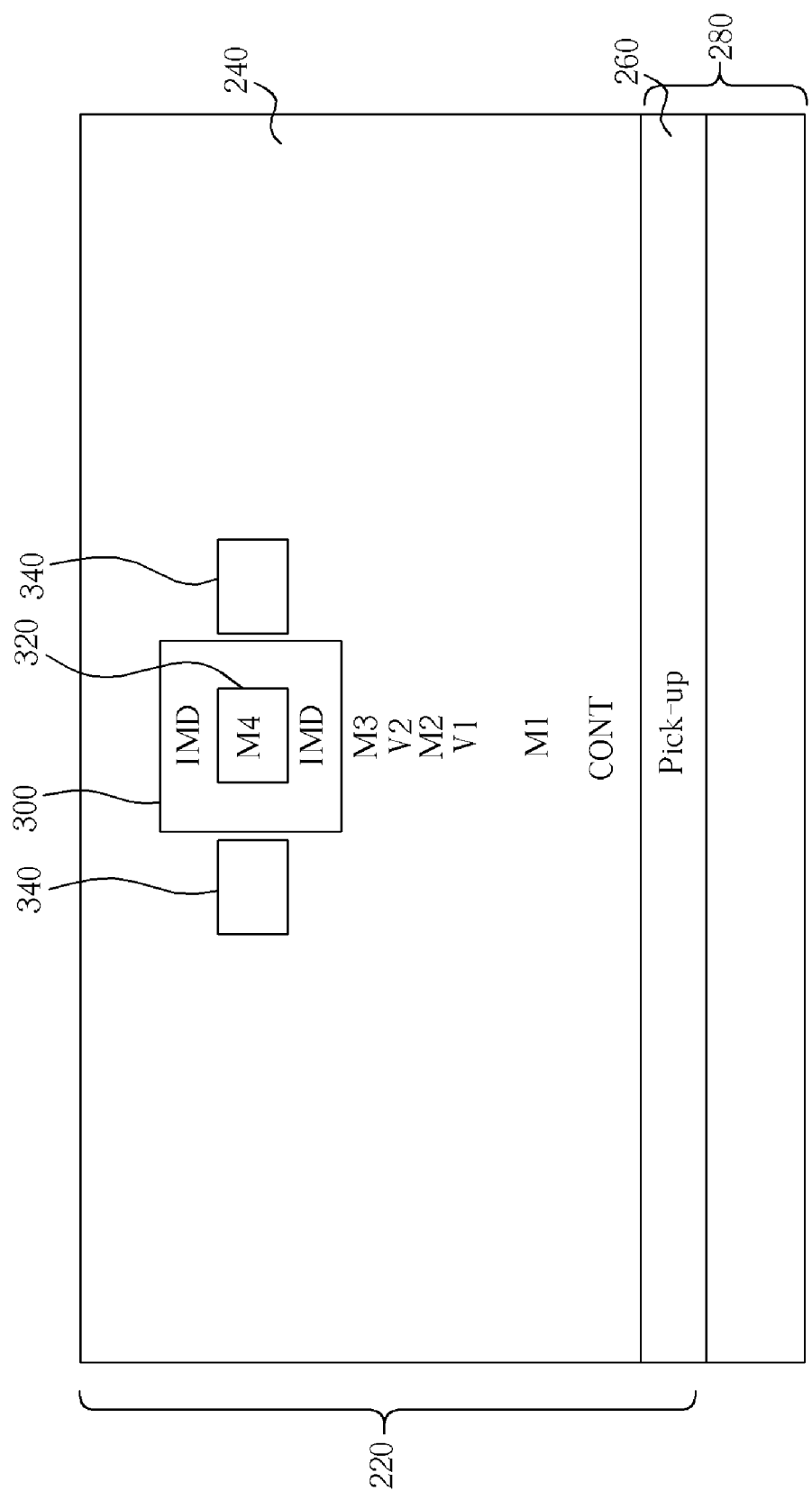
FIG. 4 is a cross-sectional view of FIG. 3 along line II-II.

Please refer to FIG. 3 and FIG. 4. FIG. 3 is a schematic top view showing a portion of the shield ring at the analog/digital interface of the SoC. FIG. 4 is a cross-sectional view of FIG. 3 along line II-II'. As shown in FIG. 3 and FIG. 4, the metal rampart 240 consisting of multi-layer metals and vias has a digital/analogy (A/D) connection window 300, which allows DSP 14 to communicate with the shielded analog/mixed-signal block 22 through a signal line 320 passing therethrough. Preferably, the position of the A/D connection window 300 is remote from the main working signal line of the analog/mixed-signal integrated circuit.

Alternatively, as specifically indicated in FIG. 3, the signal line 320 may be accompanied with two adjacent grounded lines 340, which are formed at the same metal layer, for example, the fourth metal layer (M4), as the signal line 320, and are disposed at opposite sides of the signal line 320 with a minimum rule. By doing this, the signal coupling effect on the signal line 320, which results from the high-speed digital clock, can be alleviated.

Figure 5:
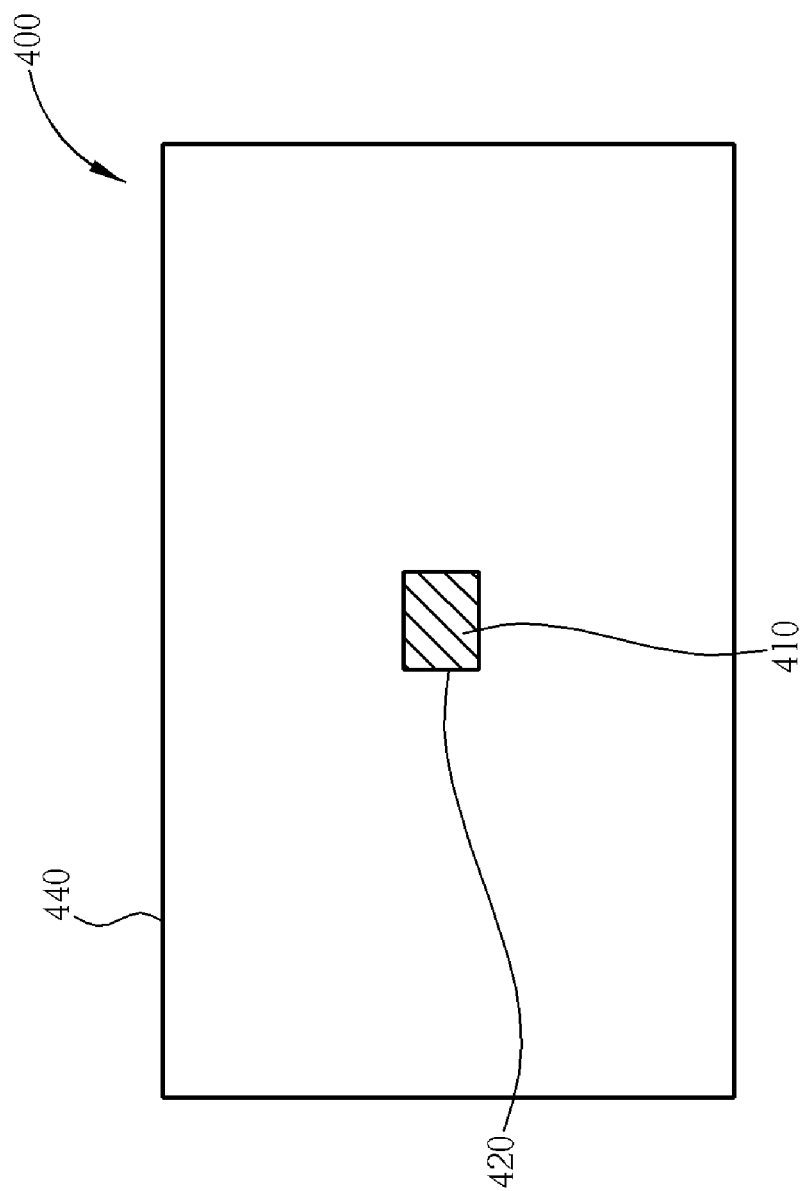
FIGS. 5-7 are schematic diagrams illustrating variations of the shield ring structure in accordance with preferred embodiments of this invention.

FIG. 5 is a schematic diagram illustrating a variation of the shield ring structure in accordance with one embodiment of this invention. As shown in FIG. 5, the shield ring structure 420 is disposed at the center of the chip 400, which surrounds a shielded region 410 such as an on-chip memory block or an analog/mixed-signal block. A seal ring 440 is disposed along perimeter of the chip 400. The seal ring 440 provides the chip 400 with protection from stress during wafer dicing. The grounded shield ring structure 420 is grounded to create a screen to avoid signal coupling caused by electromagnetic interference resulting from the digital clock circuits of the chip 400 driven at high speeds. The shield ring structure 420 may be a double-ring structure comprising two layers of ramparts.

The signal lines passing through the shield ring structure 420 are not explicitly shown. The signal lines passing through the metal rampart of the shield ring structure 420 may be at the same level or different levels. The signal lines may pass through corresponding analog/digital connection windows. Alternatively, two signal lines may pass through one analog/digital connection windows, wherein one signal line may be situated directed above the other.

Figure 6:
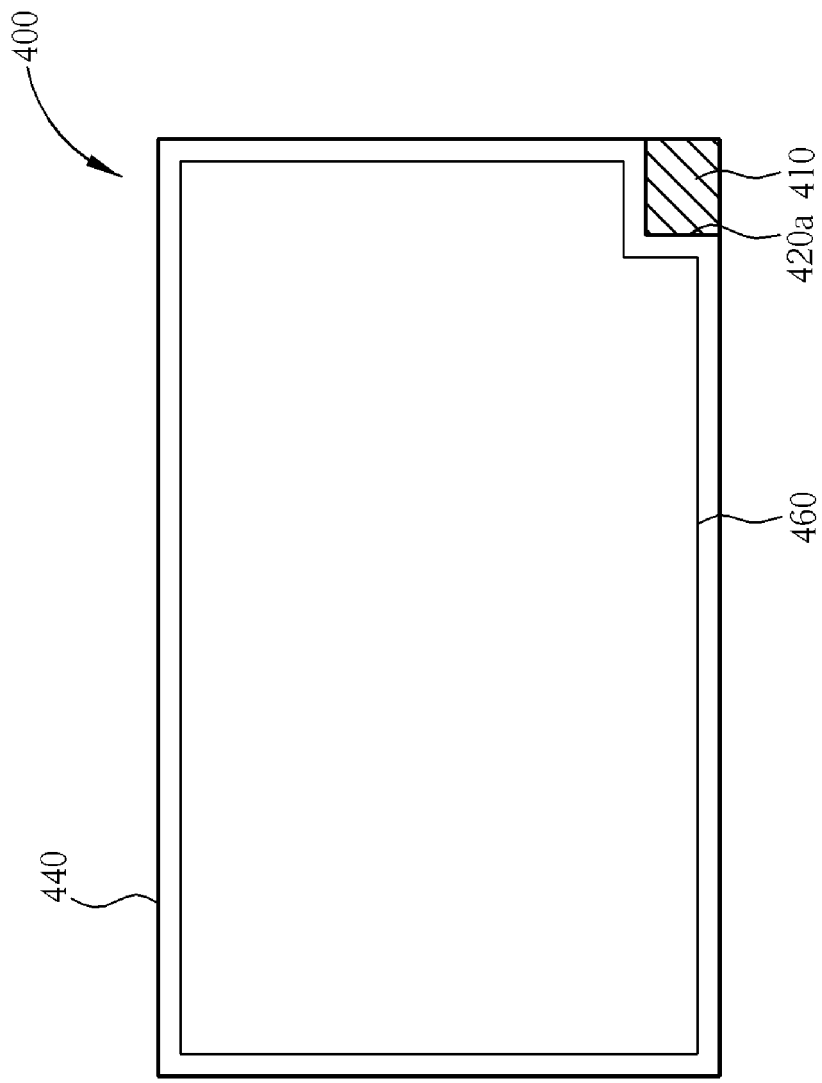

FIG. 6 is a schematic diagram illustrating another variation of the shield ring structure in accordance with one embodiment of this invention. As shown in FIG. 6, the shielded region 410 such as on-chip memory blocks or analog/mixed-signal blocks is situated at one corner of the chip 400. The shielded region 410 has four sides. Two consecutive sides of the shielded region 410 are shielded by the seal ring 440. The other two sides of the shielded region 410 are shielded by the two-side rampart 420a. A complementary shield ring 460 is disposed along the remanent seal ring 440 and along the two-side shield ring 420. Likewise, the shield ring structure 420 may be a double-ring structure comprising an inner layer and an outer layer of ramparts.

Figure 7:
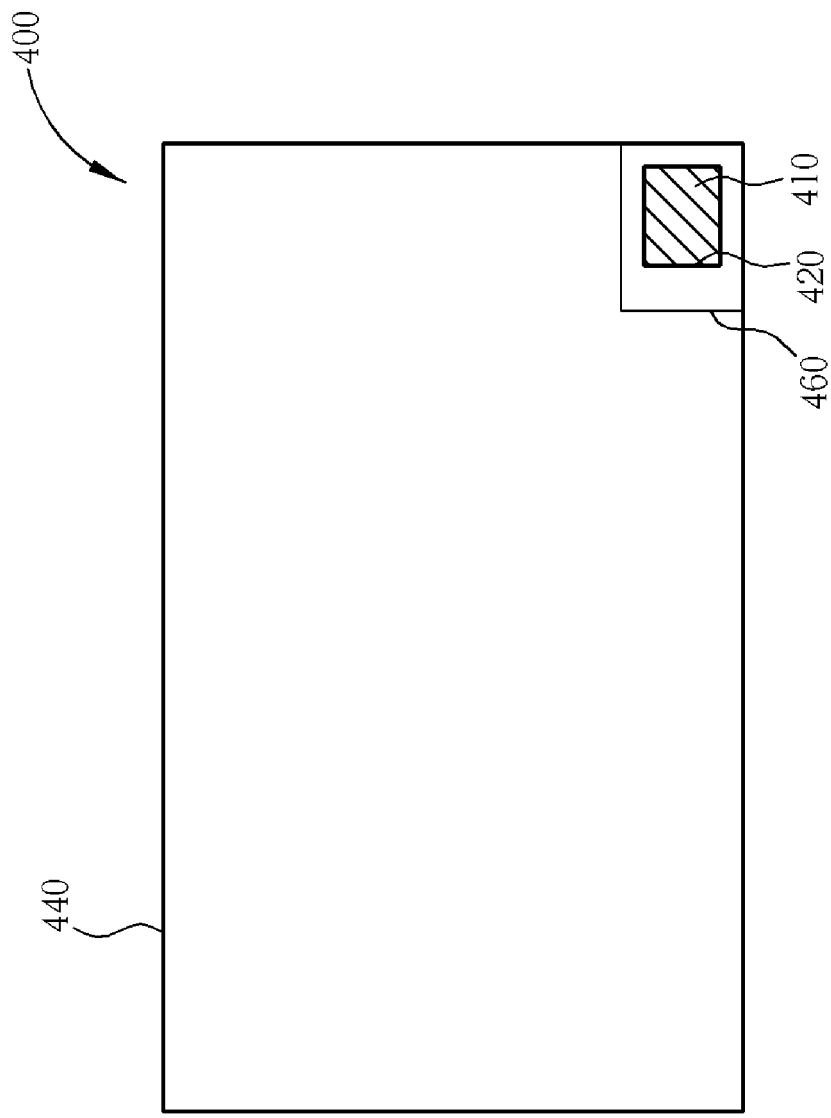

FIG. 7 is a schematic diagram illustrating still another variation of the shield ring structure in accordance with one embodiment of this invention. As shown in FIG. 7, the shielded region 410 such as on-chip memory blocks or analog/mixed-signal blocks is situated at one corner of the chip 400. The shielded region 410 is surrounded by a four-side shield ring 420. The four-side shield ring 420 is further surrounded by a two-side complementary shield ring 460 and the seal ring 440. The two-side complementary shield ring 460 is connected with the seal ring 440.

Figure 8:
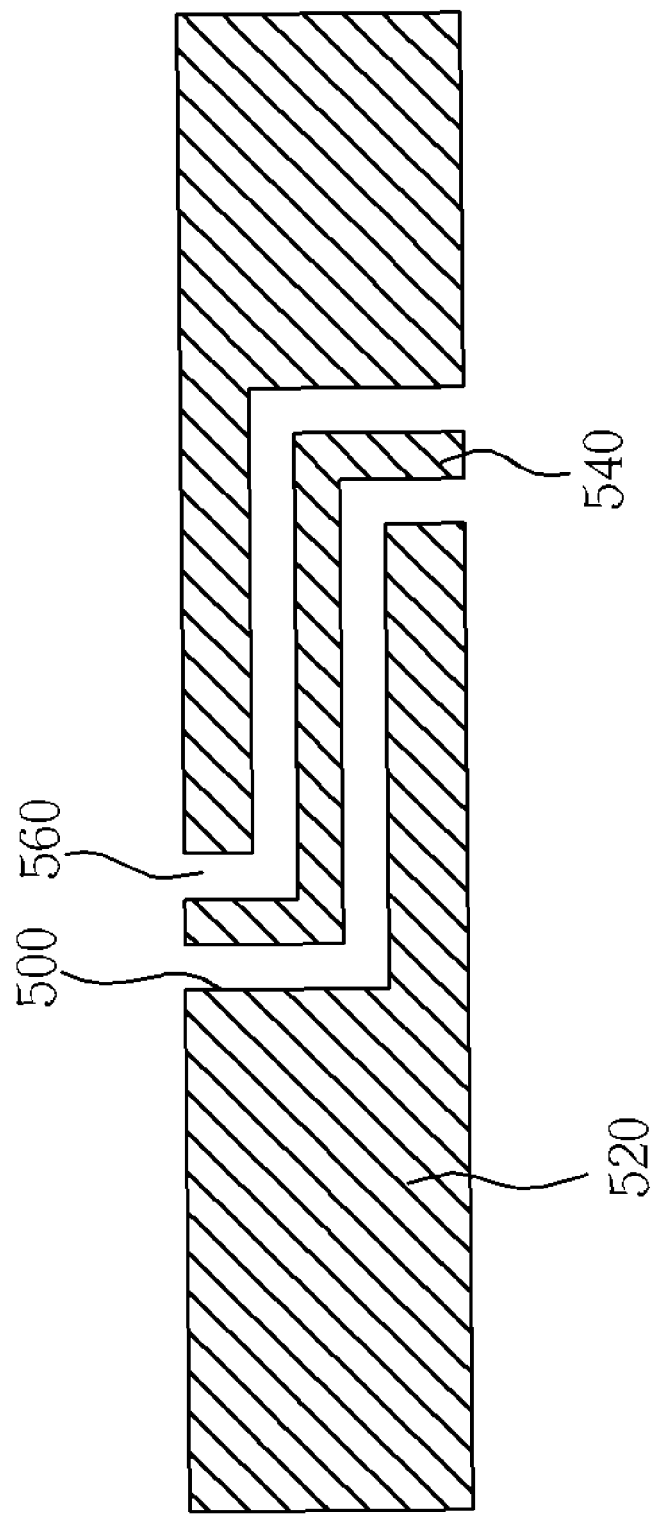
Figure 9:
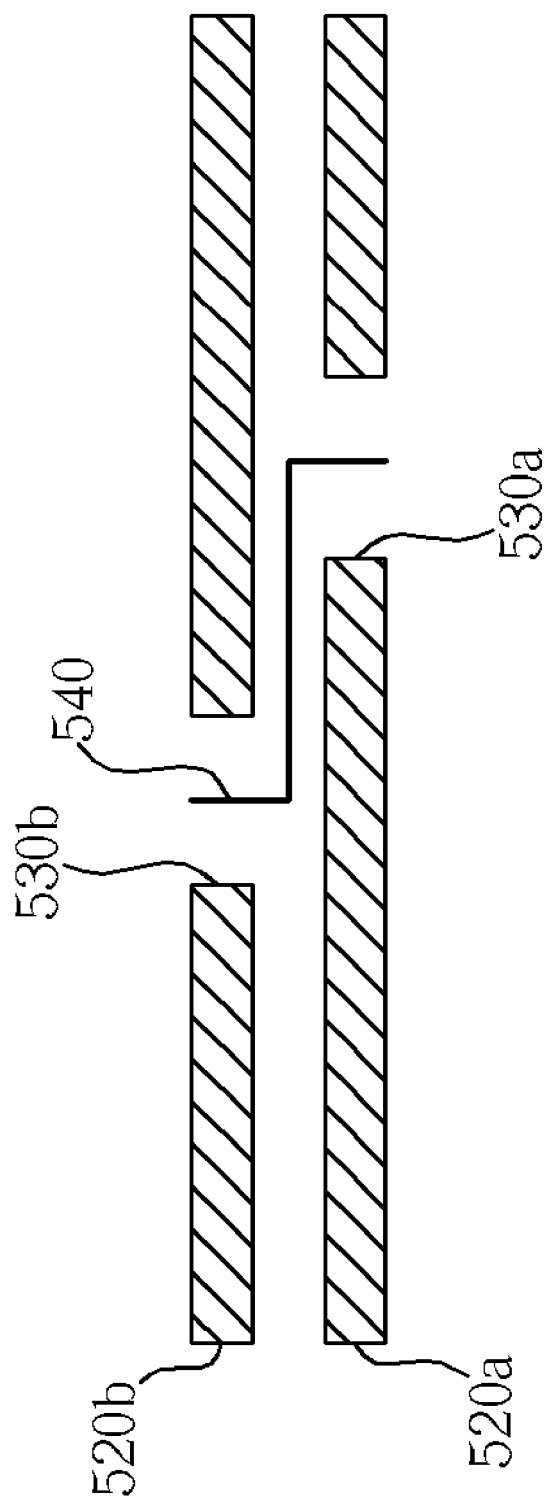
FIG. 9 are schematic top views illustrating the preferred analog/digital connection windows, channels or paths and corresponding signal lines passing therethrough according to this invention.

FIG. 8 and FIG. 9 are schematic top views illustrating the preferred analog/digital connection windows, channels or paths and corresponding signal lines passing therethrough according to this invention. As shown in FIG. 8, an enlarged portion of metal rampart of shield ring 520 is demonstrated. A serpentine analog/digital connection channel 500 extends from one side of the metal rampart of shield ring 520 to the other. A signal line 540 penetrates the metal rampart of shield ring 520 through the serpentine analog/digital connection channel 500. At least one dielectric layer 560 is interposed between the signal line 540 and the metal rampart of shield ring 520. The serpentine analog/digital connection channel 500 can reduce noise leakage.

As shown in FIG. 9, an inner metal rampart of shield ring 520a is surrounded by an outer metal rampart of shield ring 520b. The inner metal rampart of shield ring 520a has an analog/digital connection window 530a. The outer metal rampart of shield ring 520b has an analog/digital connection window 530b that is not aligned with the analog/digital connection window 530a. A signal line 540 passes through the analog/digital connection windows 530a and 520b. The analog/digital connection windows 530a and 520b may be formed at different levels. It is understood that the serpentine analog/digital connection channel 500 depicted in FIG. 8 may be formed in at least one of the metal rampart of shield ring 520a and 520b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shield structure in a chip, comprising a first rampart consisting of a plurality of metal layers and a plurality of via layers, said first rampart having a first serpentine connection channel which comprises at least two sidewalls and extends from one side of said first rampart to the other in a serpentine manner, wherein said shield structure shields a pre-selected region of said chip, and wherein at least one serpentine signal line passes through said first serpentine connection channel.

2. The shield structure in a chip according to claim 1 wherein said first rampart is connected to a pickup diffusion implanted into a substrate.

3. The shield structure in a chip according to claim 2 wherein said substrate is a silicon-on-insulator (SOI) substrate.

4. The shield structure in a chip according to claim 1 wherein said first serpentine connection channel is an analog/digital (A/D) connection channel that allows digital-to-analog communication.

5. The shield structure in a chip according to claim 1 wherein said first rampart is grounded.

6. The shield structure in a chip according to claim 1 further comprising a second rampart having a second connection window that is not aligned with said first serpentine connection channel.

7. The shield structure in a chip according to claim 6 wherein said first serpentine connection channel and said second connection window are at different levels.

8. The shield structure in a chip according to claim 1 wherein said first rampart is two-side rampart and is connected to a closed seal ring that is disposed along perimeter of said chip.

9. The shield structure in a chip according to claim 1 wherein said chip is a system-on-chip chip.

10. The shield structure in a chip according to claim 1 wherein said pre-selected region is an on-chip memory block.

11. The shield structure in a chip according to claim 1 wherein said pre-selected region is an analog/mixed-signal block.

12. The shield structure in a chip according to claim 1 further comprising a complementary shield ring surrounding area of said chip other than said pre-selected region, wherein said complementary shield ring does not contact said first rampart.

13. A shield structure in a chip, comprising a first rampart consisting of a plurality of metal layers and a plurality of via layers, said first rampart having a first connection window, wherein said shield structure shields a pre-selected region of said chip, wherein at least one serpentine signal line passes through said first connection window and wherein said first rampart is two-side rampart and is connected to a closed seal ring that is disposed along perimeter of said chip.

14. A shield structure in a chip, comprising:

a first rampart consisting of a plurality of metal layers and a plurality of via layers, said first rampart having a first connection window, wherein said shield structure shields a pre-selected region of said chip, wherein at least one serpentine signal line passes through said first connection window; and a complementary shield ring surrounding area of said chip other than said pre-selected region, wherein said complementary shield ring does not contact said first rampart.

* * * * *